United States Patent [19]
Matossian et al.

[11] Patent Number: 5,374,456
[45] Date of Patent: Dec. 20, 1994

[54] SURFACE POTENTIAL CONTROL IN PLASMA PROCESSING OF MATERIALS

[75] Inventors: Jesse N. Matossian, Canoga Park; Robert W. Schumacher, Woodland Hills; David M. Pepper, Malibu, all of Calif.

[73] Assignee: Hughes Aircraft Company, Los Angeles, Calif.

[21] Appl. No.: 995,864

[22] Filed: Dec. 23, 1992

[51] Int. Cl.$^5$ .............................. B05D 3/06
[52] U.S. Cl. ..................... 427/570; 427/444; 427/458; 427/523; 427/561
[58] Field of Search ............... 427/458, 523, 561, 570, 427/444

[56] References Cited

U.S. PATENT DOCUMENTS

| | | | |
|---|---|---|---|
| 3,583,361 | 6/1971 | Laudel | 427/523 X |
| 4,764,394 | 8/1988 | Conrad | 423/38 |
| 5,133,849 | 7/1992 | Kinoshita et al. | 427/523 |
| 5,185,067 | 2/1993 | Shibahara | 427/523 |

OTHER PUBLICATIONS

R. G. Wilson et. al, "Secondary Ion Mass Spectrometry, A Practical Handbook for Depth Profiling and Bulk Impurity Analysis", John Wiley & Sons, 1989, p. 4.3.1, Section 4.3. (no month available).

*Primary Examiner*—Bernard Pianalto
*Attorney, Agent, or Firm*—V. D. Duraiswamy; W. K. Denson-Low

[57] ABSTRACT

An object (30) is plasma processed by placing an electrically conducting grid (34) over all or a portion of the surface (32) of the object (30) so that the grid (34) generally follows the contours of the surface (32) but is displaced outwardly from the surface (32). Ions or electrons from a plasma surrounding the object (30) are accelerated into the surface (32) of the object (30) using as a processing driving force an electrical potential applied to the electrically conducting grid (34). The use of a contoured conducting grid (34) allows plasma processing of large, electrically nonconducting objects and objects having sharp surface features or recesses.

23 Claims, 1 Drawing Sheet

SURFACE POTENTIAL CONTROL IN PLASMA PROCESSING OF MATERIALS

BACKGROUND OF THE INVENTION

This invention relates to plasma processing of objects, and, more particularly, to plasma processing of electrically conducting or nonconducting objects.

The useful life of some types of objects is determined by the wear of the surface of the object. For example, the tooling used in metal forming operations such as stamping or forming must retain its close dimensional tolerances in order to be useful. When even a few thousandths of an inch of the surface is worn away, the tooling becomes ineffective and must be discarded or refurbished.

The cost of short runs of parts or pieces made with tooling is often high, due to the fixed cost of preparing acceptable tooling. One approach to reducing the tooling cost is to form the tool from a polymeric material such as an epoxy that is more readily made with the required shape and dimensions than is a comparable metal tool. The epoxy is much softer than metal, and can therefore be easily machined to the required shade and dimensional tolerances.

The surface softness that permits easy machining results in a short useful life of the tool. For production applications, an epoxy tool cannot be used without a treatment to make the surface more wear resistant. It has been found that several types of ion and electron treatments of the surfaces of polymers such as epoxies and the surfaces of metals can significantly increase their useful lives. Such treatments include, for example ion implantation, ion deposition and ion mixing, and electron bombardment.

Ion implantation is a process wherein ions are accelerated by an electrostatic potential to impact a surface. The energy of the ions causes them to be imbedded beneath the surface. A sufficient concentration of implanted ions can significantly increase the hardness of the surface layer. In ion mixing, a thin (about 300–600 Angstrom) material layer is first deposited onto a surface to be treated, and then the composite surface is ion implanted to mix the deposited material atoms into the surface. Ion deposition is similar to ion mixing except that the accelerating energies of the ions are lower, with the result that the ions are deposited simultaneously with the deposited material layer upon the surface being treated rather than imbedded beneath its surface. In electron bombardment of polymeric surfaces, energetic electrons (100–20,000 volts or more) are accelerated by an electrostatic potential to cause them to impact into the surface to be treated.

Such treatments are traditionally accomplished by accelerating a beam of electrical charge carriers (ions or electrons) using electrostatic acceleration electrodes. This approach, while effective, has the drawback that it is difficult to uniformly treat a large, three-dimensional, irregular object such as a typical automotive tool that may measure 3 feet by 5 feet by 1 foot in size. The beam of charge carriers must be moved slowly over the entire surface, including those areas that may be rather inaccessible such as deep holes or recesses, or for protrusions that stick out from the surface. In that case, the object must be manipulated to uniformly treat the area with a beam. For large tools or for large numbers of smaller objects having such surface features, surface treatment using ion or electron beams becomes prohibitively slow and expensive.

An alternative approach that has promise for ion implanting, ion depositing, or ion mixing of the surfaces of large objects is plasma ion implantation (PII), described in US Pat. No. 4,764,394. A plasma of ions is created adjacent to the surface of the object to be implanted, and the object is electrostatically charged to a potential opposite to that of the ions. For example, if positively charged nitrogen ions are to be implanted, the object is negatively charged using repetitive voltage pulses of typically about 100,000 volts or more. The nitrogen ions are attracted to the surface of the object by this accelerating potential and driven into the surface and sub-surface regions of the substrate. Plasma ion implantation has the advantage that the plasma of ions provides a source that is distributed around the entire surface area of the object, and uniform implantation over the entire surface area is simultaneously achieved. Plasma ion mixing may be performed in a similar manner, except that first a thin layer of material is deposited into the surface prior to implantation. Plasma ion deposition is also performed in a similar manner, except that the accelerating potential is typically lower so that the ions and material layer deposit upon the surface instead of being driven into the sub-surface layers. It is possible to achieve electron bombardment of a surface using the same plasma techniques used in ion implantation.

Plasma ion implantation, deposition and mixing, and electron bombardment work well for metallic objects with smooth, flat faces. However, where the object is electrically nonconducting, such as an epoxy, or is electrically conducting or nonconducting with sharp surface contours or deep recesses, the electric field distribution at the surface of the substrate is distorted and therefore nonuniform. The result is spatially nonuniform and uneven surface treatment, or a discontinuance of the surface treatment due to a space charge buildup with ensuing arcing. As an example, experiments by the inventors leading to the present invention have determined that in a plasma ion implantation system having a vacuum chamber diameter of 4 feet, some implantation can be achieved with relatively small polymeric epoxy objects, but that virtually no implantation can be achieved with epoxy objects that are four inches or more in thickness. Thus, conventional plasma ion implantation is ineffective for hardening the surface of large tooling pieces made of epoxy or other nonconducting materials. It is also ineffective for uniformly surface hardening either nonconducting or conducting objects that have sharp surface features or deep recesses.

There is a need for improved ion implantation, deposition and mixing, and electron bombardment techniques for use with electrically conducting or nonconducting objects, particularly such objects that are either relatively large in size or small in size but large in number, and such objects having sharp surface features or deep recesses. The present invention fulfills this need, and further provides related advantages.

SUMMARY OF THE INVENTION

The present invention provides an improved plasma processing technique for use with electrically nonconducting objects and objects with sharp features. It is particularly suited for spatially uniform implantation of large objects such as automotive tooling and the like made from epoxy or other nonconducting materials. It is also useful for surface hardening any type of object, either electrically conducting or electrically nonconducting, with sharp features, such as drill bits, sharp-edged tooling, and the like. The approach achieves surface processing results on such objects that are comparable with the results achieved for conventional flat, electrically conducting objects.

In accordance with the invention, a method for plasma processing an object comprises the steps of providing an object having a surface and placing an electrically conducting grid over the surface of the object. The grid generally follows the contours of the surface but is displaced outwardly from the surface. The surface of the object is plasma processed with charge carriers (ions or electrons) produced in a plasma, using, as a processing driving force, an electrical potential applied to the electrically conducting grid.

As used herein, the term "plasma processing" is a term of art that encompasses plasma ion implantation, plasma ion deposition and mixing, electron bombardment, and related techniques. These processes are distinct but related. Plasma ion implantation and mixing use a high accelerating voltage that results in a distribution of ions below the surface of the object, while plasma ion deposition uses a lower accelerating voltage that results in most of the ions being deposited upon the surface of the object. Electron bombardment uses a high accelerating voltage, opposite in polarity to that used in ion implantation, that results in a distribution of electrons beneath the surface of the object. The apparatus used to practice these various techniques is similar, the principal difference being the polarity and magnitude of the accelerating voltage used. Thus, "charge carriers" as used herein includes both ionic charge carriers and electrons.

A key to the present invention is that the object be placed in a constant-potential volume, which is preferably achieved by the placement of an electrically conducting grid over the surface of the object being plasma processed. The grid can be used to cover the entire surface of the object that is being plasma processed, or it can be used to cover a portion of the surface of the object. In the latter case, the remainder of the surface of the object must be covered with a metal foil or other electrical conductor. In either case, the grid is displaced outwardly from the surface of the object. The grid is maintained at an electrical potential opposite to that of the charge carriers, and at a sufficiently high voltage to accelerate the charge carriers into the surface. The grid is preferably made of a mesh of thin wires about 0.010 inches thick and arranged such that at least 70 percent of the area of the grid piece is open. It is preferably spaced at least about ½ inch from the surface of the object in order to ensure uniform plasma processing. The grid material is an electrical conductor selected, in most cases, so as to minimize sputtering of material from the grid onto the object being treated. In the case where the material is intentionally desired to be sputtered or deposited onto the surface of the object, the grid material can likewise be chosen appropriately.

When placed in proximity to, but not touching, the surface of the object being plasma processed, the grid aids in accelerating the ion or electron charge carriers toward the surface and conducting away charge that would otherwise accumulate at the surface. The grid is shaped to make the electric potential field more uniform near the surface of the object, effectively "smoothing" the electric potential field while still achieving uniform processing of the surface, which is typically three-dimensional and may have surface irregularities. The arcing that prevents plasma processing of surfaces having sharp features is thereby avoided, so that both electrically conducting objects and electrically nonconducting objects having sharp surface features may be plasma processed. Placement of the grid at a distance above the surface avoids a "shadow" effect of the grid wires on the surface of the object being plasma processed. The charge carriers from the plasma are accelerated toward the surface of the object at a variety of angles that reach the regions directly below the wires of the mesh as well as the regions below the openings in the mesh. The grid may also be moved relative to the surface of the object in a manner that eliminates the shadowing effect of the grid.

The present invention thus provides an approach for plasma processing electrically nonconducting objects, particularly large, thick objects that cannot be otherwise processed by any other known plasma treatment process. It also provides a method for plasma processing all objects that have sharp surface features which would otherwise prevent uniform plasma ion processing due to electric field intensification leading to arcing effects, or recesses. In this manner, the present invention achieves surface potential control of objects being plasma processed. Other features and advantages of the invention will be apparent from the following more detailed description of the preferred embodiment, taken in conjunction with the accompanying drawings which illustrate, by way off example, the principles of the invention.

DETAILED DESCRIPTION OF THE INVENTION

Figure 1:
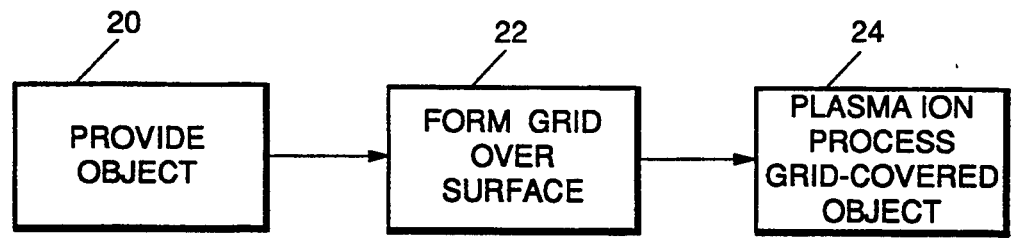
FIG. 1 is a process flow chart for the plasma ion processing method of the invention.
Figure 2:
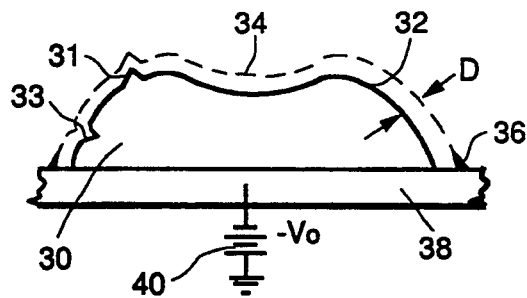
FIG. 2 is a sectional view of an object with a grid formed over its entire surface.
Figure 3:
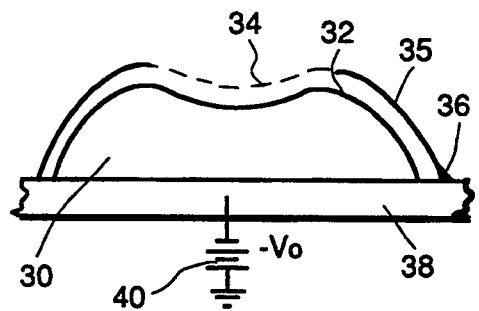
FIG. 3 is a section view of an object with a grid formed over a part of its surface.
Figure 4:
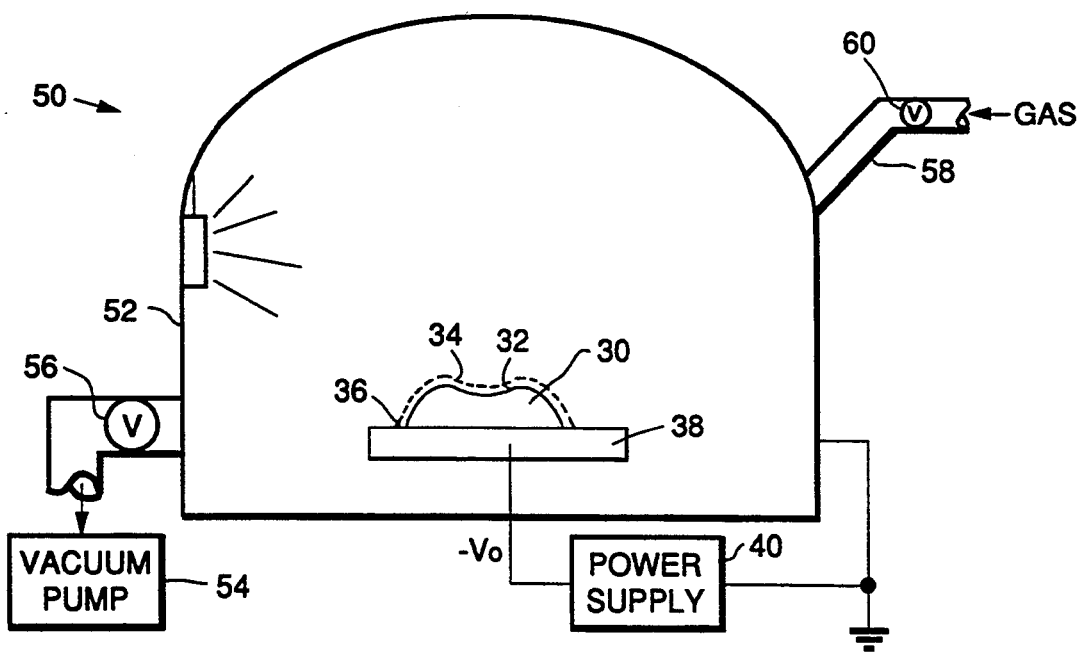
FIG. 4 is a schematic sectional view of a plasma ion processing apparatus.

The preferred embodiments of the invention relate to plasma ion processing of objects, and are described in relation to this process. Similar approaches are used for plasma electron processing, with the principal differences being, as previously discussed, the polarity and magnitude of the applied voltages. Thus, FIG. 1 is a flow chart of the method for preparing a plasma ion processed object. FIGS. 2-3 depict two embodiments of the object during its preparation, and FIG. 4 shows the plasma ion processing apparatus.

Referring to FIG. 1, in a first step, numeral 20, an object 30 (FIGS. 2 and 3) to be plasma ion processed is provided. In one preferred embodiment, the object 30 is a polymeric material such as an epoxy polymer. The object 30 can be made of other electrically nonconducting objects such as ceramics or glass. In the application of most interest to the inventors, the object 30 is an epoxy tool used in automobile component manufacturing and having dimensions of 3 feet by 5 feet by 1 foot thick, or larger.

In another preferred embodiment, the object 30 has sharp features, such as shown at numeral 31, or recesses, such as shown at numeral 33, in FIG. 2. In this embodiment, the object can be either electrically conducting, such as a metal, or electrically nonconducting, as previously described. Although the various embodiments are discussed in reference to a single set of drawings FIGS. 1-4, it is understood that these embodiments are separate and distinct. The invention may be practiced in reference to a smooth electrically nonconducting object, an electrically nonconducting object having sharp surface features or deed recesses, or an electrically conducting object having sharp surface features or deep recesses. It could also be practiced in reference to a smooth electrically conducting object, but treatment of such objects can generally be accomplished with conventional techniques.

A surface 32 of the object 30 is covered by an electrically conducting metallic grid 34, numeral 22 of FIG. 1. The grid 34 is made of an electrically conducting wire such as copper, stainless steel, or titanium. The wire is off small size, preferably about 0.010 inches in diameter. The grid 34 is woven from the wire in the manner of a window screen with an open mesh, preferably having at least 70 percent open space.

The resulting grid is readily formed into approximately the shape of the surface 32 off the object 30. The terminology "generally following the contours of the surface" and related expressions, as used herein, are meant to convey the sense that the grid need not conform precisely to the surface of the object, with precisely the same outward displacement from the surface at every location, for the invention to be operable. A virtue of the present approach is that it tolerates variations in shape and spacing of the grid 94 as compared with the surface contours of the object 30. The grid 34 thus need not conform precisely to the shape of the surface 92, but should generally follows its contours.

The entire surface 92 of the object 30 to be plasma ion processed is covered by the grid 34, as shown in the embodiment of FIG. 2. In an alternative approach as shown in FIG. 3, a portion of the surface 32 to be ion processed is covered by the grid 34, and the remainder of the surface 32 is covered by a solid electrically conducting mask 35, such as aluminum foil. The mask 35 prevents plasma processing in the covered areas, but permits implantation, deposition, or mixing to occur through the grid 94 in the manner previously discussed. In both embodiments, an electrically conducting shell is formed over the entire surface of the object that is to be treated.

The grid 34 does not touch the surface 32 of the object 30. Instead, the grid 34 is spaced outwardly from the surface 32 by a distance D. The distance D should be at least about ½ inch, and may be greater. Studies have shown that if the grid 34 is placed directly against the surface 32 or spaced less than about ½ inch from the surface, the subsequently implanted ions do not reach the areas of the object 30 that are directly under the wires that form the grid 34 due to a shadowing effect of the grid wires. Thus, there would be an alternating pattern of plasma ion processed and non-processed regions according to the pattern of the grid 94. Spacing the grid 34 by a distance of at least about ½ inch has been found to be sufficient to produce a substantially spatially uniform ion implantation or deposition pattern in the surface 32 of the object 30 after plasma ion processing is complete. It is believed that the outward spacing of the grid 34 from the surface 32 allows the ions in the plasma to approach the surface 32 from a range of directions, sufficient to ensure ion implantation or deposition at all locations on the surface. The grid 34 may be formed over the surface in a freestanding manner, as shown in FIG. 2 or FIG. 3, or may be supported by an insulated clamp or the like. Preferably, spacers between the object 30 and the grid 34 are not used, because the spacers would mask a region off the surface from ion implantation or deposition.

The grid 34 is made of an electrically conducting material, which is electrically connected, as by a weld 36, to an electrically conducting base plate 38. The base plate 38 is, in turn, electrically connected to a power supply 40 or pulse modulator that biases the grid 34 in a desired manner. In the preferred embodiment, the implanted or deposited ions are positively charged nitrogen ions. The grid is therefore biased negatively relative to the processing chamber walls.

In the absence of a grid covering the surface being treated, when a flat piece of an electrically conducting metal is plasma ion implanted or deposited, the electric field lines induced by the applied voltage all terminate uniformly on the surface of the metal piece and perpendicular to the surface to achieve uniform processing. Because a metal presents an equipotential surface, the applied voltage develops at every point on the surface of the metal. Ions are therefore implanted with the full applied voltage. However, when the object is an electrical nonconductor, the electric field lines pass through the object to the base plate. There is a voltage drop inside the object that increases with increasing thickness of the object. The voltage at the surface of the object therefore is less than the applied voltage and is likely to be nonuniform. Ions are therefore not implanted with the full applied voltage, because a nonconductor does not present an equipotential surface. The electric field lines are not perpendicular to the surface of the object which adds to the nonuniformity of the plasma ion processing. Because electrons cannot flow to the surface of the nonconducting object to cancel the charge carried by the implanted ions, a space charge can develop that inhibits further implantation and there may be surface arcing that can damage the surface of the object. Where the object has sharp features such as those shown at numeral 31, the electric potential field lines are distorted, leading to large gradients and arcing B from the sharp feature.

Although applicant does not wish to be limited to this explanation, and the operability of the invention does not depend upon any particular explanation of the effect of the grid 34, it is believed that the grid creates a constant potential (equipotential) volume around the object that is devoid of electric field gradients. In this manner, the grid "smooths" the surface electric potential of the object as compared to the case where no grid is present. The constant potential volume aids in achieving a uniform deposition at all points around the surface, regardless of whether there are sharp features on the surface. The grid also aids in either neutralizing or conducting away charge carried to the surface of the object with the electrically charged ions flowing from the plasma to the surface for deposition or implantation, an important consideration when an electrically nonconducting object is being implanted.

The grid-covered object 30 is plasma ion processed, numeral 24 of FIG. 1, utilizing a plasma ion processing apparatus 50, FIG. 4. The apparatus 50 includes a vacuum chamber 52 pumped by a vacuum pump 54 through a gate valve 56. The gas to be ionized and plasma ion implanted or deposited is backfilled to the interior of the chamber 52 through a gas line 58 having a valve 60. The object 30 is supported in the vacuum chamber 52 in the manner previously discussed in relation to FIG. 2. The metallic grid 34 is electrically connected to the base plate 38, which in turn is biased to a potential by the power supply 40 or pulse modulator. In the case of the preferred nitrogen plasma ion processing, the grid 34 is pulsed to a negative potential. The walls of the vacuum chamber 52 are maintained at ground relative to the pulsed negative voltage.

To conduct plasma ion processing with this apparatus 50, the chamber 52 is first pumped out through the valve 56 to a vacuum of about $10^{-6}$ Torr. Nitrogen (or other gas to be ionized) is backfilled through the valve 60 to a steady state pressure of about $1-10 \times 10^{-5}$ Torr. The plasma ion processing voltage $-V_o$ is applied in a pulsed fashion by the power supply 40 or voltage modulator. Typical operating parameters are a repetition rate of the applied voltage pulses of 100–1000 cycles per second, with a pulse duration for the applied voltage of 10–30 microseconds. The plasma is usually created using a working gas such as nitrogen, and using a discharge voltage of 100 volts and a discharge current of 1–10 amperes. For nitrogen plasma ion implantation, the negative applied potential is preferably minus 100,000 volts or more, but can be varied as necessary. For plasma ion deposition using nitrogen to form titanium nitride by reacting with titanium provided to the vacuum chamber, the negative potential is preferably minus about 100 to minus about 1000 volts. Typical implantation times under these conditions are 4–8 hours to implant a dose of $1-10 \times 10^{17}$ per square centimeter. Typical deposition times under these conditions are 4–8 hours to deposit a surface layer about 1–5 micrometers thick. Further details of plasma ion processing apparatus and procedures are described in US Pat. No. 4,764,394, whose disclosure is incorporated by reference.

The following examples are presented to illustrate aspects of the invention, and should not be taken as limiting the invention in any respect.

EXAMPLE 1

During preliminary studies, attempts were made to ion implant a number of epoxy specimens by the conventional approach, without the use of an electrically conducting grid. The diameter of the implantation apparatus was 4 feet. A thin piece of epoxy having a thickness of about ¼ inch was successfully ion implanted with nitrogen. Thicker pieces were also tried, up to 4 inches in thickness. For either thin or thick samples with no grid present, ion implantation could not be conducted using the preferred parameters described previously. Ion implantation could only be achieved using a repetition rate of no greater then 100 cycles per second, a pulse duration no greater than 5 microseconds, and a plasma created using a discharge voltage of 100 volts and a discharge current no greater than 0.5 amperes. For implantation parameters outside these ranges, severe arcing occurred at the surface of the objects.

When a grid was used with these objects, was found that implantation could be achieved with the preferred parameters described previously and without experiencing arcing.

EXAMPLE 2

An epoxy die object to be used in metal stamping prototype operations was ion implanted using the grid technique of the invention. The die had a size of 3 feet by 5 feet by 1 foot thick. A metallic grid made of 0.010 inch thick stainless steel wires with an open area of about 70 percent of the total area was molded over the surface of the die, such that the grid generally followed the contours of the die but was separated from the surface of the die by a distance D of about ½ inch. This distance varied somewhat at different locations, and small variations were not found to adversely affect the ion implantation process. The grid was spot welded to the base plate at several locations to ensure good electrical contact. Portions of the surface of the die were masked so that comparisons of implanted and non-implanted regions could be made. Additionally, some small stainless steel foils were placed against the surface of the die, under the grid but not touching it, for later study.

The vacuum chamber was evacuated to a pressure of about $10^{-6}$ Torr, and backfilled with a pressure of about $5 \times 10^{-5}$ Torr nitrogen. The nitrogen pressure was maintained constant during the ion implantation process as nitrogen was consumed. Implantation was conducted for a period of 10 minutes with a applied voltage $-V_o$ of about $-100,000$ to about $-110,000$ volts, a pulse width of 10 microseconds, and a pulse repetition rate of 200 cycles per second. The implantation dose under these conditions was measured to be $1.0 \times 10^{15}$ ions per square centimeter.

After implantation, the die was removed from the vacuum chamber and visually inspected. The portions under the grid and not masked were discolored with a substantially uniform dull green color, indicating ion implantation in these regions. The discoloration was uniform in two senses. First, it was uniform throughout the die object, indicating that implantation had occurred throughout the surface. Second, upon closer inspection the discoloration was uniform locally, indicating that there was little or no shadowing effect of the wires of the grid.

There was no discoloration or implantation under the masked regions.

The ion implantation depth profile of the stainless steel foil pieces that were placed against the surface of the die, under the grid, was determined by secondary ion mass spectroscopy (SIMS). For comparison, a similar piece of stainless steel was plasma ion implanted in the conventional fashion, using the same operating parameters as described for the grid-covered epoxy die. The depth profile of implanted nitrogen for the stainless steel pieces were nearly identical. This result establishes that the grid technique of the present invention permits the full implantation voltage to be developed at the surface of the epoxy die, so that the implantation depth profile with the grid technique is the same as that achieved with the conventional technique. The difference is that the grid technique permits such profiles to be achieved with electrically nonconducting materials as well as electrically conducting materials.

EXAMPLE 3

Hardness tests of epoxy coupons placed in the implanted and non-implanted regions of the die of Example 2 were conducted using a standard Knoop hardness indentor. An improvement by nearly a factor of two in hardness was realized for the ion implanted coupons as compared with those that were not implanted. This result verifies that the ions implanted using the grid approach can result in an improved surface hardness of the nonconductive material.

EXAMPLE 4

Studies were carried out with epoxy test blocks to determine the effect of varying the distance D between the surface of the implantation test object and the grid. When D is zero, with the grid pressed tightly against the surface, ion implantation is achieved through the open areas of the grid but not under the wires that form the grid. After implantation, the grid pattern was clearly reproduced across the surface of the object. This testing was repeated for other objects with the grid spaced progressively further from the surface. With increasing spacing D, implantation began to occur under the wires, and the contrast between the regions under the wires and the open regions was reduced. At distances D of about ½ inch or more, the ion implantation pattern becomes uniform, with no apparent difference between the regions beneath the wires and those in the open spaces of the grid.

The present invention thus provides an important advance in the art of plasma processing. Electrically nonconducting objects of arbitrarily large size can be plasma processed with a uniform processing distribution, using conventional apparatus but with the presence of the electrically conducting grid. Electrically conducting or nonconducting objects with sharp surface features or deep recesses can also be plasma ion processed with spatially uniform dosages or layers. Electron bombardment can be achieved by biasing the grid to a potential that is opposite in polarity to that used in plasma ion processing. Although a particular embodiment of the invention has been described in detail for purposes of illustration, various modifications may be made without departing from the spirit and scope of the invention. Accordingly, the invention is not to be limited except as by the appended claims.

What is claimed is:

1. A method or plasma processing an object, comprising the steps of:
   providing a three-dimensional, irregularly shaped object having a contoured surface;
   placing an electrically conducting grid over the contoured surface of the object, the grid generally following the three-dimensional contours of the surface but being displaced outwardly from the surface; and
   plasma processing the surface of the object with charge carriers produced in a plasma, the step of plasma processing including the steps of
      generating a plasma of charge carriers around and adjacent to the contoured surface of the object, and
      independently of generating the plasma, applying a plurality of pulses of an electrical accelerating voltage to the grid, the voltage being opposite in polarity to the charge carriers of the plasma.

2. The method of claim 1, wherein the charge carriers are ions.

3. The method of claim 1, wherein the charge carriers are electrons.

4. The method of claim 1, wherein the grid covers the entire surface of the object.

5. The method of claim 4, wherein the grid provides a constant potential volume that encloses the object.

6. The method of claim 1, wherein the grid covers a portion of the surface of the object, a conducting foil covers the remainder of the surface of the object, and the grid and conducting foil are electrically conducting.

7. The method of claim 6, wherein the grid and conducting foil together provide a constant potential volume that encloses the object.

8. The method of claim 1, wherein the method of plasma processing achieves ion deposition on surface of the object, and the step of plasma processing includes the step of
   plasma ion depositing ions onto the surface of the object, using as a depositing driving force an electrical potential applied to the electrically conducting grid sufficient to deposit ions onto the surface but not implant ions into the surface.

9. The method of claim 1, wherein the method of plasma processing achieves ion implantation into the surface of the object, and the step of plasma processing includes the step of
   plasma ion implanting ions into the surface of the object, using as an implanting driving force an electrical potential applied to the electrically conducting grid sufficient to implant ions into the surface.

10. The method of claim 1, wherein the step of plasma processing achieves ion mixing into the surface of the object.

11. The method of claim 1, wherein the step of plasma processing achieves electron bombardment into the surface of the object.

12. The method of claim 1, wherein the object is electrically conducting.

13. The method of claim 1, wherein the object is electrically nonconducting.

14. The method of claim 1, wherein the object is made of a polymeric material.

15. The method of claim 1, wherein the electrically conducting grid has an open area fraction of at least about 70 percent.

16. The method of claim 1, wherein the electrically conducting grid is made of a material that has substantially no sputter deposition onto the surface of the object.

17. The method of claim 1, wherein the electrically conducting grid is made of a material that sputter deposits onto the surface of the object.

18. The method of claim 1, wherein the electrically conducting grid is displaced outwardly from the surface of the electrically nonconducting object by at least about ½ inch.

19. The method of claim 1, wherein the surface of the object has a sharply shaped feature thereon, and the grid is shaped to generally conform to the feature.

20. The method of claim 1, wherein the surface of the object has a recess thereon, and the grid is shaped to generally conform to the recess.

21. A method for plasma processing an object, comprising the steps of:
   providing an electrically nonconducting, three-dimensional object having a contoured exposed surface;
   placing an electrically conducting grid over the contoured exposed surface of the object, the grid generally following the three-dimensional contours of the exposed surface but being displaced outwardly from the exposed surface to form a constant-potential volume adjacent to the entire exposed surface; and plasma processing the exposed surface of the object with charge carriers produced in a plasma, the step of plasma processing including the steps of generating a plasma around and adjacent to the exposed surface of the object, and independently of generating the plasma, applying a plurality of pulses of an electrical accelerating voltage to the grid.

22. A method for plasma processing an object, comprising the steps of:

providing an object having an exposed surface;

creating an equipotential surface adjacent to the exposed surface of the object but displaced outwardly from the exposed surface; and plasma processing the exposed surface of the object with charge carriers produced in a plasma, the step of plasma processing including the steps of generating a plasma of charge carriers around the exposed surface of the object, and independently of generating the plasma, applying a plurality of pulses of an electrical accelerating voltage between the equipotential surface and the plasma.

23. The method of claim 22, wherein the plasma is created outside of the equipotential surface.

* * * * *